United States Patent
Wang

(10) Patent No.: US 9,741,777 B2
(45) Date of Patent: Aug. 22, 2017

(54) BOTTOM-EMITTING OLED DISPLAY PANEL

(71) Applicant: BOE TECHNOLOGY GROUP CO., LTD., Beijing (CN)

(72) Inventor: Huifeng Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 15/130,017

(22) Filed: Apr. 15, 2016

(65) Prior Publication Data

US 2017/0092707 A1  Mar. 30, 2017

(30) Foreign Application Priority Data

Sep. 29, 2015  (CN) .......................... 2015 1 0634549

(51) Int. Cl.
*H01L 27/32*  (2006.01)
*H01L 51/52*  (2006.01)

(52) U.S. Cl.
CPC ...... *H01L 27/3258* (2013.01); *H01L 27/3248* (2013.01); *H01L 27/3262* (2013.01); *H01L 51/5206* (2013.01); *H01L 51/5271* (2013.01); *H01L 2251/301* (2013.01); *H01L 2251/5307* (2013.01); *H01L 2251/558* (2013.01)

(58) Field of Classification Search
CPC ............. H01L 51/0545; H01L 51/0036; H01L 51/0541; H01L 51/5012; H01L 33/20
See application file for complete search history.

(56) References Cited

U.S. PATENT DOCUMENTS

2004/0217702 A1* 11/2004 Garner ................ H01L 51/5275
 313/512

* cited by examiner

*Primary Examiner* — Quoc Hoang
(74) *Attorney, Agent, or Firm* — Collard & Roe, P.C.

(57) ABSTRACT

A bottom-emitting OLED display panel is provided. The bottom-emitting OLED display panel includes: a driving transistor disposed on a substrate; a protective layer covering the driving transistor; a planarization layer disposed on the protective layer; and a OLED device disposed on the planarization layer; and a reflective structure disposed between the protective layer and the planarization layer, the reflective structure is configured for reflecting light emitted from the OLED device and radiated on the reflective structure; a bottom surface of the reflective structure which is close to the protective layer at least covers a region occupied by the driving transistor.

15 Claims, 4 Drawing Sheets

BOTTOM-EMITTING OLED DISPLAY PANEL

CROSS REFERENCE TO RELATED APPLICATIONS

Applicant claims priority under 35 U.S.C. §119 of Chinese Application No. 201510634549.0 filed on Sep. 29, 2015, the disclosure of which is incorporated by reference.

TECHNICAL FIELD

Embodiments of the present disclosure relate to a bottom-emitting OLED display panel.

BACKGROUND

Compared to liquid crystal displays, organic-light-emitting-diode (OLED) displays have advantages of self-luminous property, rapid response speed, wide viewing angle, high contrast, bright color, light and thin body and so on, which are considered as a next generation of display technique. A self-luminous element (i.e., an OLED device) therein is mainly constituted by an anode layer, an organic material functional layer (normally including a functional layer such as an electron transport layer, an light emitting layer, and a hole transport layer and so on) and a cathode layer in an order of being gradually farther from a substrate. According to different emitting direction, the OLED device can be classified into two types: bottom-emitting (i.e., emitting downwards with respect to the substrate) and top-emitting (emitting upwards with respect to the substrate).

Since the cathode layer is normally constituted of a metal simple substance and/or an alloy material with a low work function, which has a low light transmittance, in order to reduce the effect of the cathode layer on the entire light extracting rate of the top-emitting OLED device, the thickness of the cathode layer needs to be made thinner, and meanwhile a reflective metal is used as the anode layer to further increase the light transmittance. However, the less the thickness of the cathode layer is, the larger a resistance Rs of its sheet resistance (whose symbol is Rs, and the expression is $Rs=\rho/t$; wherein, $\rho$ is a resistivity of the electrode, t is a thickness of the electrode) is, so that a voltage drop of the top-emitting OLED device (IR Drop, i.e., a potential difference between two ends of the resistor) is severe, so that the voltage drop of the OLED light-emitting surface which is farther from a power supply location (i.e., the driving transistor connected with the anode layer) is more significant, resulting in significant uneven light emitting of the top-emitting OLED device.

In addition, since the top-emitting OLED device utilizes the cathode layer as an light exiting side, and since the light transmittance of the material constituting the cathode layer is lower, the cathode layer acts as a semi-transparent thin film with a reflection function, so that a microcavity is formed between the cathode layer and the reflective anode layer therebelow, so that the top-emitting OLED device has stronger microcavity effect, that is, the top-emitting OLED device with a specific cavity length can only emit a specific wavelength of light, so when manufacturing the top-emitting OLED device, requirements on the thicknesses of the respective layers are stricter. Thus, each of the above-mentioned factors causes current difficulty in mass production of the top-emitting OLED devices.

Thus, current OLED devices mainly utilize a bottom-emitting structure with simple manufacturing process, relatively mature technology and easy mass production, and rays are emitted from the bottom-emitting OLED run through the anode layer and are emitted from the substrate side, and the anode layer may utilize materials with a high work function and higher light transmittance such as Indium Tin Oxide (ITO) and graphene which have little influence on the light extracting rate, and no microcavity effect; meanwhile, since light is not emitted from the cathode layer side, the cathode layer will not have a too small thickness to cause a problem of too large Rs resistance.

SUMMARY

An embodiment of the invention provides a bottom-emitting OLED display panel, comprising: a driving transistor disposed on a substrate; a protective layer covering the driving transistor; a planarization layer disposed on the protective layer; a OLED device disposed on the planarization layer; a reflective structure disposed between the protective layer and the planarization layer, the reflective structure is configured for reflecting light emitted from the OLED device and radiated on the reflective structure; and a bottom surface of the reflective structure which is close to the protective layer at least covers a region occupied by the driving transistor.

In some embodiments, the reflective structure includes a body part and a reflection layer. In some embodiments, the body part has a bottom surface and a top surface arranged in parallel and at least one side surface connecting the bottom surface and the top surface, the side surface is a concave cambered surface or a flat surface, and the reflective layer is at least disposed on one side surface of the body part. In some embodiments, an area of the bottom surface is larger than an area of the top surface, the bottom surface and the top surface are rectangles with geometric centers overlapped, and two adjacent sides of the rectangles respectively parallel a gate line and a data line of the bottom-emitting OLED display panel, and the body part has four side surfaces. In some embodiments, along a direction perpendicular to a panel surface of the bottom-emitting OLED display panel, a cross section pattern of the body part has a circular arc, and the circular arc is a semicircle or an inferior arc; and the reflective layer at least covers half of the circular arc, the half of the circular arc has a halving line in a direction in parallel with the gate line or the data line of the bottom-emitting OLED display panel.

BRIEF DESCRIPTION OF THE DRAWINGS

In order to illustrate the technical solutions of the embodiments of the present disclosure more clearly, the drawings of the embodiments are simply described below. Apparently, the drawings described below relate to only some embodiments of the present disclosure and are not limitative of the present disclosure.

REFERENCE SIGNS

Figure 1:
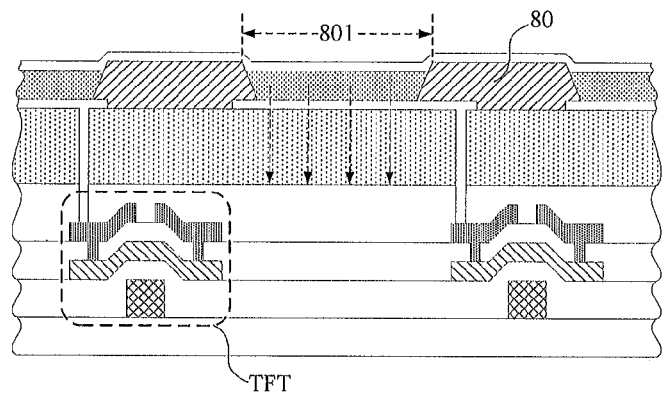
FIG. 1 is a cross section structural diagram of the bottom-emitting OLED display panel.

01—bottom-emitting OLED display panel; 10—substrate; 20—driving transistor; 21—gate insulator layer; 22—inter-layer insulator layer; 23—gate line; 24—data line; 30—protective layer; 40—planarization layer; 50—OLED device; 501—transparent anode; 502—organic material functional layer; 503—metal cathode; 60—reflective structure; 60a—bottom surface (bottom side); 60b—top surface; 60c—side surface; 60d—cambered surface; 601—body part; 602—reflective layer; 70—through hole; 80—pixel defining layer; 801—opening part.

DETAILED DESCRIPTION

To make clearer the objects, technical solutions and advantages of the embodiments of the present disclosure, a clear and full description of the technical solutions of the embodiments of the present disclosure will be made with reference to the accompanying drawings of the embodiments of the present disclosure. Obviously, the embodiments described are merely part of rather than all of the embodiments of the present disclosure. Based on the embodiments of the present disclosure described, all the other embodiments acquired by a person of ordinary skill in the art, without any creative labor, fall within the scope of protection of the present disclosure.

In the description of the present disclosure, it's to be noted that, unless otherwise clearly regulations and limitations, all the terms (including technical and scientific terms) used in the embodiments of the disclosure have common meanings commonly understood by the person skilled in the art, and its further to be noted that, those terms defined in common dictionaries should be understood as having consistent meanings in the context of related technology, but should not be translated in an idealism or extremely formalization meaning, unless otherwise clearly defined herein.

Further, in the description of the disclosure and claims, the terms "on", "below", etc., indicating directional or positional relations are merely based on the directional or positional relations as shown in the drawings, only for the purposes of describing the disclosure and simplifying the description, rather than indicating or suggesting that the devices or components have to be at such specific locations, be constructed and operated in such specific locations, which can't be understood as limitations on the disclosure.

The person skilled in the art should further understand that, since the structure dimensions of the array substrate in the embodiments of the disclosure are very tiny, in order to clearly show them, the dimensions of the structures in the drawings of the embodiments of the disclosure and the relative thickness of the layers are enlarged, which do not represent actual dimensions.

FIG. 1 is a cross section structural diagram of a bottom-emitting OLED display panel. As shown in FIG. 1, since the emitting direction of the bottom-emitting OLED device is downward, and if light irradiates on the driving transistor therebelow, a phenomenon of photogenerated leakage current will occur, which affect display performance, there is a pitch between a projection of an opening part 801 of the pixel defining layer (Pixel Defining Layer, simply called PDL) 80 for defining light emitting area of respective bottom-emitting OLED devices on the substrate and a projection of the driving transistor on the substrate, that is, the opening part 801 of the PDL is arranged far from the driving transistor. As such, the light emitting area of the bottom-emitting OLED device is limited, and its light extracting rate is limited, and the lifetime of the light emitting material of the OLED device is affected significantly.

Figure 2A:
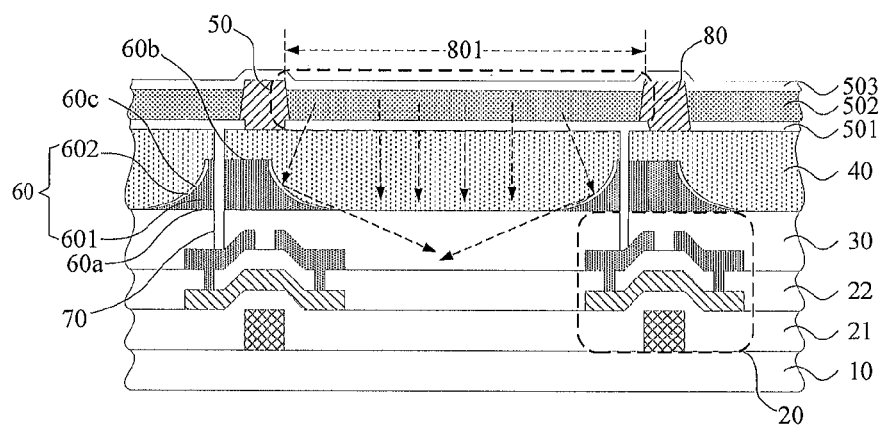
FIG. 2A is a first cross section structural diagram of the bottom-emitting OLED display panel provided by an embodiment of the present disclosure.
Figure 2B:
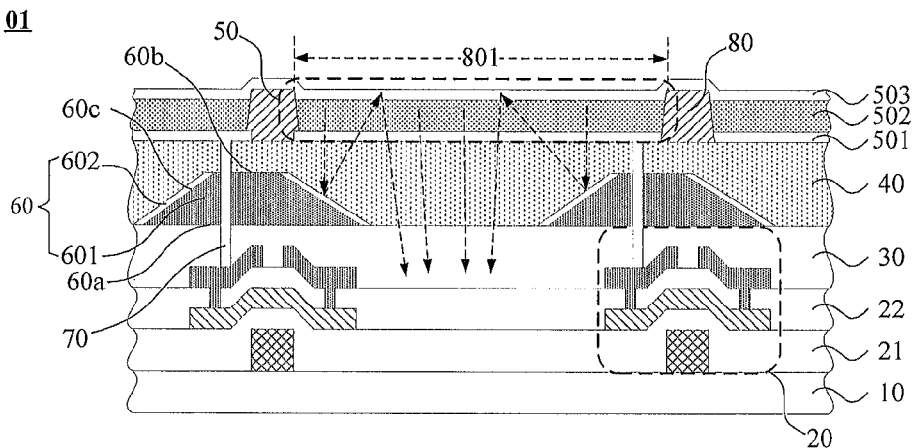
FIG. 2B is a second cross section structural diagram of the bottom-emitting OLED display panel provided by an embodiment of the present disclosure.
Figure 2C:
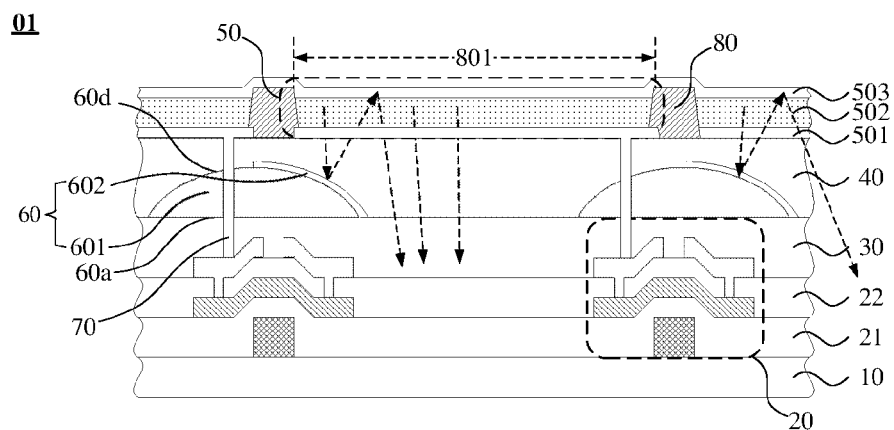
FIG. 2C is a third cross section structural diagram of the bottom-emitting OLED display panel provided by an embodiment of the present disclosure.

The embodiment of the disclosure provides a bottom-emitting OLED display panel 01, as show in FIG. 2A to FIG. 2C, the bottom-emitting OLED display panel 01 includes: a driving transistor 20 disposed on a substrate 10, a protective layer 30 covering the driving transistor 20, a planarization layer 40 disposed on the protective layer 30, and a OLED device 50 corresponding to the driving transistor 20 and disposed on the planarization layer 40; a reflective structure 60 corresponding to the driving transistor 20 and disposed between the protective layer 30 and the planarization layer 40, the reflective structure 60 is configured for reflecting light emitted from the OLED device 50 and radiated on the reflective structure 60; wherein, the reflective structure 60 has a bottom surface 60 which is close to the protective layer 30 at least covers a region occupied by the driving transistor 20.

Thus, the embodiment of the invention provides a bottom-emitting OLED display panel, comprising: a driving transistor disposed on a substrate; a protective layer covering the driving transistor; a planarization layer disposed on the protective layer; a OLED device disposed on the planarization layer; and a reflective structure disposed between the protective layer and the planarization layer, the reflective structure is configured for reflecting light emitted from the OLED device and radiated on the reflective structure; wherein the reflective structure has a bottom surface which is close to the protective layer at least covers a region occupied by the driving transistor.

In some embodiments, the reflective structure includes a body part and a reflection layer. In some embodiments, the body part has a bottom surface and a top surface arranged in parallel and at least one side surface connecting the bottom surface and the top surface, the side surface is a concave cambered surface or a flat surface, and the reflective layer is at least disposed on one side surface of the body part. In some embodiments, an area of the bottom surface is larger than an area of the top surface, the bottom surface and the top surface are rectangles with geometric centers overlapped, and two adjacent sides of the rectangles respectively parallel a gate line and a data line of the bottom-emitting OLED display panel, and the body part has four side surfaces. In some embodiments, along a direction perpendicular to a panel surface of the bottom-emitting OLED display panel, a cross section pattern of the body part has a circular arc, and the circular arc is a semicircle or an inferior arc; and the reflective layer at least covers half of the circular arc, the half of the circular arc has a halving line in a direction in parallel with the gate line or the data line of the bottom-emitting OLED display panel.

In some embodiments, the reflective layer is arranged on the four side surfaces of the body part, the top surface and the bottom surface are both square.

In some embodiments, the side surface of the body part is concave cambered surface, wherein the concave cambered surface has a radian of 5 to 30° covered by the reflective layer; or the side surface of the body part is a flat surface, an angle between the flat surface covered by the reflective layer and the bottom surface is 5 to 30°. In some embodiments, the cross section pattern of the body part has a circular arc, and the arc of the circular arc is an inferior arc, and an angle between a tangent line at an end point of the inferior arc and the bottom surface of the reflective structure which is close to the protective layer is 5 to 30°.

In some embodiments, the OLED device includes a transparent anode, an organic material functional layer and a metal cathode, which are gradually farther from the substrate; and the transparent anode is connected with a drain electrode of the driving transistor via a through hole passing through the planarization layer, the reflective structure and the protective layer.

In some embodiments, the through hole passes through the reflective structure via a top surface of the body part; or, the through hole passes through the reflective structure via another half of the circular arc which is not covered by the reflective layer.

In some embodiments, the reflective layer is mainly constituted of at least one selected from the group consisting of a metal simple substance and a metal alloy; wherein, the metal simple substance is selected from any one of argentum, zinc, aluminium, cuprum, manganese, germanium, yttrium, bismuth, scandium and cobalt, the metal alloy includes at least one selected from the group consisting of argentum alloy, zinc alloy, aluminium alloy, cuprum alloy, manganese alloy, germanium alloy, yttrium alloy, bismuth alloy, scandium alloy and cobalt alloy.

In some embodiments, a thickness of the reflective layer is 20 to 500 nm.

In some embodiments, the body part is mainly constituted of a photosensitive resin material.

In some embodiments, a thickness of the body part is 1 to 10 μm.

The bottom-emitting OLED display panel provided by the embodiment of the disclosure can increase the light emitting area of the OLED device, and increase the light extracting rate and the lifetime of the light emitting material in the OLED device.

In particular, with the above bottom-emitting OLED display panel provided by the embodiment of the disclosure, since the reflective structure is arranged above the location corresponding to the driving transistor, and the bottom surface of the reflective structure near the protective layer at least covers a region occupied by the driving transistor, i.e., the length and the width of the bottom surface of the reflective structure is equal to or greater than the length and the width of the driving transistor, as such, since the reflective structure blocks the light irradiated on the driving transistor, the area of the opening part of the PDL for defining light emitting area of the OLED device can be increased, i.e., the light emitting area of the bottom-emitting OLED device can be increased.

Further, since the reflective structure capable of reflecting the light irradiated on its surface is arranged above the location of the driving transistor, the light, after two-times of reflections and/or multiple times of reflections, can be finally re-emitted out of pixels, so as to increase the light extracting rate of the OLED device and the lifetime of the light emitting material of the OLED device.

It is to be noted that, firstly, the reflective structure 60 corresponds to the driving transistor 20, i.e., the reflective structure 60 is located on the driving transistor 20, and the above mentioned reflective structure 60 is arranged on the driving transistor 20 for driving the OLED device 50 to perform displaying.

In this case, the structure type of the driving transistor 20 may be bottom gate type or top gate type. In an example of the bottom gate type as shown in FIG. 2A to FIG. 2C, the above mentioned bottom-emitting OLED display panel 01 may further include: a gate insulating layer 21 for isolating a gate and an active layer, and an inter-layer insulating layer 22 located between a source electrode, a drain electrode and an active layer, acting as an etch stop layer (ESL), and the source electrode and the drain electrode are connected with the active layer via the through holes in the inter-layer insulator layer 22.

Secondly, the function of the protective layer 30 is to insulate and isolate the driving transistor 20 disposed on the substrate 10 and other structures on the protective layer 30, and at least one material with good isolation property and compact structure, such as silicon oxide, silicon nitride, silicon oxynitride and aluminium oxide and so on, can be used. In an example of silicon oxide, its thickness may be 2500±10% Å.

Third, the reflective structure 60 is not limited to the shape as shown in any one of FIG. 2A to FIG. 2C to reflect the light irradiated on its surface, the cross section pattern along a direction perpendicular to the substrate 10 may be triangle, or a pattern with its surface having semicircle-like protrusion of a waviness shape, as long as the light emitted from the OLED device and irradiated on reflective structure 60 can be reflected.

Further, in order to increase the reflectivity of the reflective structure 60 for the light irradiated on its surface, as shown in 2A to FIG. 2C, the reflective structure 60 may further be constituted of a body part 601 and a reflective layer 602 located on a surface of the body part. In this case, the reflective layer 602 may be constituted of metal simple substance and/or alloy with high reflectivity.

Fourth, as known from the above description, since the reflective structure 60 disposed on the protective layer 30 has a protruded shape, while the OLED device 50 normally includes an anode, a cathode and an organic material functional layer, when manufacturing the OLED device 50, the above-mentioned respective layers of structures need to be successively formed on a relatively flat surface. Thus, a planarization layer 40 is still needed to be disposed on the protective layer 30 to cover the reflective structure 60, i.e., the thickness of the planarization layer 40 is larger than the height of the reflective structure 60, the planarization layer 40 can be constituted of insulated material with a relatively high transmittance, such as resin and so on. In an example of resin, its thickness may be 2 to 20 μm.

Based on this, in the bottom-emitting OLED display panel 01 provided by the embodiment of the disclosure, since the reflective structure 60 is disposed above the location corresponding to the driving transistor 20, and the bottom surface 60 of the reflective structure 60 near the protective layer 30 side at least cover the region occupied by the driving transistor 20, i.e., the length and the width of the bottom surface of the reflective structure 60 is at least equal to the length and the width of the driving transistor 20, as such, since the reflective structure 60 blocks the light irradiated on the driving transistor 20, the area of the opening part 801 of the PDL for defining light emitting area of the OLED device can be increased, i.e., the light emitting area of the bottom-emitting OLED device 50 can be increased. For example, the PDL may be arranged so that its projection on the substrate does not cover the projection of the driving transistor 20 on the substrate.

Further, since the reflective structure 60 capable of reflecting the light irradiated on its surface is arranged above the location of the driving transistor 20, the light, after two-times of reflections and/or multiple times of reflections, can be finally re-emitted out of the middle part of the pixels (i.e., a region between the driving transistors of two pixel units), so as to increase the light extracting rate of the OLED device 50 and the lifetime of the light emitting material of the OLED device 50.

Herein, the bottom-emitting OLED display panel 01 provided by the embodiment of the disclosure can be particularly applied to any products or apparatus having a display function such as an OLED display device, a digital camera, a mobile phone, a flat computer and so on.

Base on the above, as shown in 2A to FIG. 2C, the OLED device 50 particularly includes: a transparent anode 501, an organic material functional layer 502 and a metal cathode 503, which are gradually farther from the substrate 10; wherein, the transparent anode 501 is connected with a drain electrode of the driving transistor 20 via a through hole 70 passing through the planarization layer 40, the reflective structure 60 and the protective layer 30.

It is to be noted that, firstly, since the anode of the OLED device 50 normally utilizes materials with high work function such as Indium Tin Oxide (ITO), Indium Zinc Oxide (IZO), Fluorine-Doped Tin Oxide (FTO) and graphene and so on. The materials have high light transmittance, and thus, for the bottom-emitting OLED display panel, the transparent anode 501 is normally disposed therebelow. The distance between the transparent anode 501 disposed therebelow and the drain electrode of the driving transistor 20 is relatively small, so the voltage drop of the signal voltage transmitted from the drain electrode to the transparent anode 501 is relatively small, and the problem of uneven light emitting is not likely to be caused.

Further, since the light reflected by the reflective structure 60 will enter the inside of the OLED device 50 again, in order to increase the reflectivity of the cathode with respect to the light, the cathode may utilize metal materials with high reflectivity, for example Cu simple substance or alloy.

Secondly, the through hole 70 connecting the transparent anode 501 and the drain electrode can be formed by successive etching opening processes. In particular, a first through hole can be formed on the protective layer 30, and then the reflective structure 60 is formed on the protective layer 30, and a second through hole can be formed on a location corresponding to the first through hole by a corresponding patterning process, and then the planarization layer 40 is formed on the reflective structure 60, and a third through hole is formed on locations corresponding to the first and second through holes on the planarization layer 40, since the locations of the first, second and third through holes are overlapped, the through hole 70 passing through the planarization layer 40, the reflective structure 60 and the protective layer 30 is formed.

Of course, the above-mentioned opening process can be flexibly adjusted according to types of particular materials of the planarization layer 40, the reflective structure 60 and the protective layer 30, and for example, the process steps for forming the above-mentioned first, second and third through holes can be reduced to steps of only forming two through holes or directly forming the above-mentioned through hole 70.

Based on the above, two particular embodiments are provided below to describe the above-mentioned reflective structure 60 in detail.

Embodiment 1

Figure 3A:
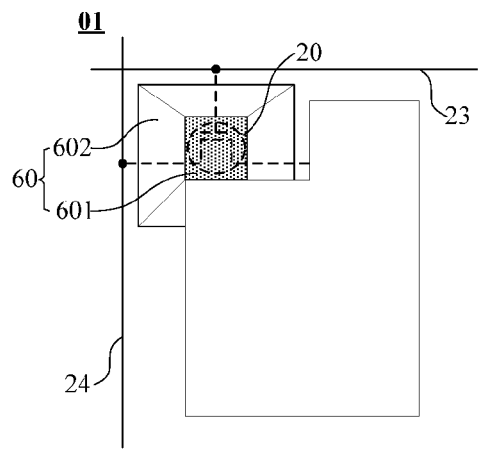
FIG. 3A is a top structural view corresponding to FIG. 2A and FIG. 2B.

As shown in 2A or FIG. 2B, the above-mentioned reflective structure 60 includes a body part 601 and a reflective layer 602; wherein, the body part 601 is constituted of a bottom surface 60a and a top surface 60b arranged in parallel, side surfaces 60c connecting the bottom surface 60a and the top surface 60b are concave cambered surfaces or flat surfaces; an area of the bottom surface 60a is larger than an area of the top surface 60b, the bottom surface 60a and the top surface 60b are rectangles with geometric centers overlapped, and as show in FIG. 3A, two adjacent sides of the rectangles respectively parallel a gate line 23 and a data line 24 of the display panel; the reflective layer 602 at least covers one side surface 60c of the body part 601.

It is to be noted that, firstly, when the side surfaces 60c connecting the bottom surface 60a and the top surface 60b are concave cambered surfaces, as shown in 2A, the shape of the body part 601 is similar to the structure of a car lampshade. Since the side surfaces 60c are concave cambered surfaces, by properly adjusting a radian of the concave cambered surfaces arranged with the reflective layer 602 (for example, as 5 to 30°, or as 15 to 20°), after the light emitted from the OLED device 50 are irradiated on the reflective layer 602 of the concave cambered surfaces, the light can be directly emitted out of and inclined downward the middle portion of the pixel unit again, which reduces the reflectivity degree of the light and has little influence on the light intensity.

When the side surfaces 60c connecting the bottom surface 60a and the top surface 60b are flat surfaces, as shown in 2B, the shape of the body part 601 is a trustum of a pyramid. By properly adjusting slope angles of the side surfaces 60c arranged with the reflective layer (for example as 5 to 30°, or as 15 to 20°), the light irradiated on the surface of the reflective structure 60 are reflected for only a few times, for example, for only two times, i.e., the light can be re-emitted from the middle portion of the pixel, to avoid impairment on the intensity of the light due to multiple-times of reflections.

Herein, since the reflective structure 60 is a three-dimensional structure, and FIG. 2A and FIG. 2B are cross section diagrams of the above-mentioned bottom-emitting OLED display panel 01 along a direction of from the source electrode to the drain electrode, in the diagrams, the cross section pattern of the reflective structure 60 is embodied as a trapezoid-like shape with concave side surfaces or a normal trapezoid shape.

Secondly, the area of the bottom surface 60a of the body part 601 near the protective layer 30 is larger than the area of the top surface 60b far away from the protective layer 30, i.e., the side surface 60c has a concave cambered surface or a slope angle with respect to the bottom surface 60a, such design can facilitate the light irradiated on a side surface of the reflective structure 60 to move toward the middle portion of the pixel unit and be finally re-emitted.

Further, as shown in FIG. 3A, the bottom surface 60a and the top surface 60b are rectangles with geometric centers overlapped, and two adjacent sides of the rectangles are in parallel with a gate line and a data line, the aim of this design is to make the light emitted from the OLED device 50 of a pixel unit and irradiated on the side surface of the reflective structure 60 further be emitted from the middle portion of the pixel unit, and avoid light interference and avoid influence on display quality.

In FIG. 3A, in order to clearly show the top view structure of the reflective structure 60, the driving transistor 20 covered by the reflective structure 60 is shown in dashed lines.

Thirdly, the reflective layer 602 is mainly constituted of metal simple substance and/or metal alloy with high reflectivity such as argentum, zinc, aluminium, cuprum, manganese, germanium, yttrium, bismuth, scandium and so on. Since the too large thickness of the reflective layer 602 will not significantly increase the reflectivity for light, and too small thickness will cause uneven coverage of a thin film, the thickness of the reflective layer 602 is for example 20 to 500 nm.

Further, if the reflective layer 602 is disposed on the four side surfaces 60c of the body part, then the top surface 60b and the bottom surface 60a are square, so that the radians or the angels between the concave cambered surfaces and the four side surfaces 60c provided with the reflective layer 602 and the bottom surface 60a are made equal, which results in more even reflections of the reflective structure 60 for the light.

Fourth, the body part 601 may be constituted of a photosensitive resin material, by using exposure and development processes to remove it, no additional wet or dry etch process is needed, the manufacturing process is simple, and the weight of the solid structural formed by a resin material is relatively light, so the entire weight increase of the bottom-emitting OLED display panel is relatively small, which will not affect the development toward the thinner and lighter display panel.

Herein, the thickness of the body part 601 is for example 1 to 10 µm, and such thickness, i.e., the distance between the top surface 60b and the bottom surface 60a can make the reflective structure 60 has side surfaces 60c with larger area, so that when the reflective layer 602 at least covers one side surface 60c of the body part 601, the light emitted from the OLED device 50 and irradiated on its surface can be sufficiently reflected, to increase the light extracting rate of the OLED device 50 as much as possible.

Considering that the through hole 70 of the transparent anode 501 and the drain electrode need to pass through the planarization layer 40, the reflective structure 60 and the protective layer 30, and the reflective layer 602 part of the reflective structure 60 is constituted of metal, if the through hole 70 is made to pass through the reflective layer 602, the times of etching processes for forming the through hole 70 would be increased, thus, for example, the through hole 70 passes through the reflective structure 60 via the top surface 60b of the body part 601 which is provided with no metal layer.

Embodiment 2

Figure 3B:
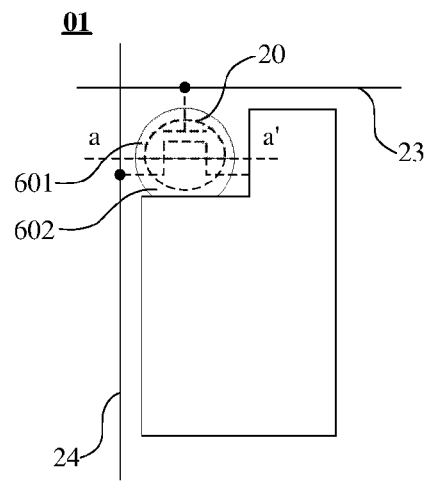
FIG. 3B is a top structural view corresponding to FIG. 2C.

As shown in FIG. 2C, the reflective structure 60 includes the body part 601 and the reflective layer 602; wherein, along a direction perpendicular to a panel surface of the bottom-emitting OLED display panel 01, a cross section pattern of the body part 601 is a circular arc, the circular arc is a semicircle or an inferior arc; and as shown in FIG. 3B, the reflective layer 602 at least covers half of the circular arc 60d, the half of the circular arc 60d has a halving line in a direction in parallel with the gate line 23 or the data line 24 of the bottom-emitting OLED display panel 01 (shown in the a-a' dashed line in the drawing).

It is to be noted that, firstly, when the reflective layer 602 only covers the half of the circular arc 60d, and the half of the circular arc 60d has a halving line in a direction in parallel with the gate line or the data line of the bottom-emitting OLED display panel 01, the light emitted from the OLED device 50 of a pixel unit and irradiated on the side surface of the reflective structure 60 can be further emitted from the middle portion of the pixel unit, to avoid light interference and avoid influence on display quality.

Herein, in order to clearly show the top view structure of the reflective structure 60, in the FIG. 3B, the driving transistor 20 covered by the reflective structure 60 is shown in dashed lines.

Secondly, in the above reflective structure 60, if the arc of the circular arc is an inferior arc, then an angle between a tangent line along an end point of the inferior arc and a bottom surface 60a of the reflective structure near the protective layer 30 is 5 to 30°, for example 15 to 20°). The angle scope can properly set the reflective layer 602 arranged on the surface of the inferior arc to have a suitable reflection efficiency, and make the light irradiated on the surface of the reflective structure 60 can be reflected for only a few times, for example, for only two times, then the light can be re-emitted from the middle portion of the pixel, to avoid impairment on the intensity of the reflected light.

Thirdly, considering that the through hole 70 connecting the transparent anode 501 and the drain electrode of the driving transistor 20 should pass through the planarization layer 40, the reflective structure 60 and the protective layer 30, and the reflective layer 602 part of the reflective structure 60 is constituted of metal, if the through hole 70 is made to pass through the reflective layer 602, the times of etching processes for forming the through hole 70 would be increased, thus, for example, the reflective layer 602 only covers the half of the circular arc, and the through hole 70 passes through the reflective structure 60 via another half of the circular arc not covered by the reflective layer 602, i.e., when forming the through hole 70, it is not necessary to make the through hole 70 pass through the reflective layer 602 portion of metal, so as to decrease the difficulty for forming the through hole 70.

In addition, the particular materials of the body part 601 and the reflective layer 602 and thickness parameters can be based on the above embodiment 1, which will not need to be described again herein.

A particular manufacturing process for forming the above-mentioned bottom-emitting OLED display panel 01 is provided below, in which the shape of the formed reflective structure 60 only takes an example of the trustum of a pyramid as shown in FIG. 2B.

Figure 4:
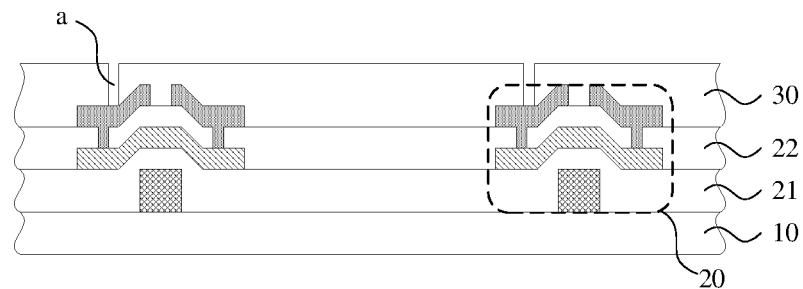
FIG. 4 to FIG. 9 are respectively flow diagrams for manufacturing an bottom-emitting OLED display panel provided by an embodiment of the present disclosure.

S1, as shown in FIG. 4, a protective layer 30 is deposited above the substrate 10 (i.e., normally, TFT substrate, in which TFT is a shortened form for thin film transistor) provided with a driving transistor 20. And by patterning process, a first through hole (labeled as a in the drawings) is formed at a location above the drain electrode of the driving transistor 20, to expose the drain electrode.

In this case, the patterning process in the step S1 and the subsequent steps represents a process of applying a mask for one-time, exposing and developing through a photoresist, (wet or dry) etching, and removing the photoresist.

Figure 5:
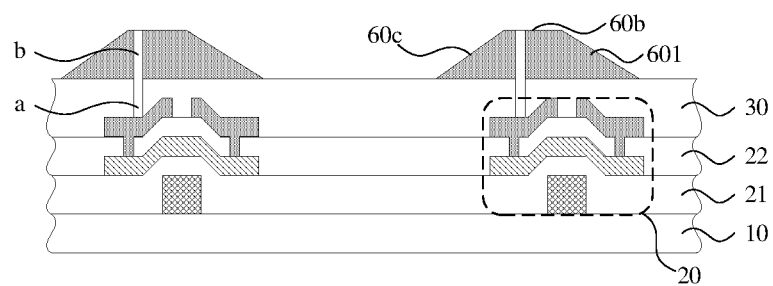

S2, as shown in FIG. 5, the body part 601 of the reflective structure 60 in a shape of a trustum of a pyramid is deposited above the protective layer 30 and at a location corresponding to the driving transistor 20, and a second through hole (labeled as b in the drawings) at a location overlapped with the first through hole a is formed on the top surface 60b of the trustum of a pyramid by patterning process.

In this case, the area of the bottom surface 60a of the body part 601 should be larger than the area of the region occupied by the driving transistor 20, so as to prevent the driving transistor 20 from being irradiated by the light of the OLED device.

Figure 6:
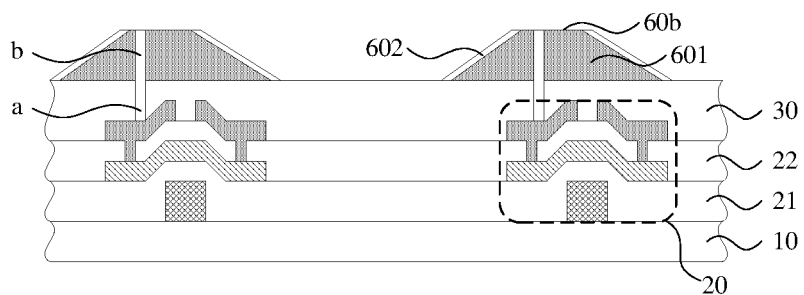

S3, as shown in FIG. 6, a film layer of metal aluminium is deposited on the surface of the body part 601, and the metal portion on the top surface 60b of the body part 601 is removed by patterning process, so as to form the reflective layer 602 on the side surface 60c of the trustum of a pyramid, and expose the second through hole b and the first through hole a passing through the body part 601.

Figure 7:
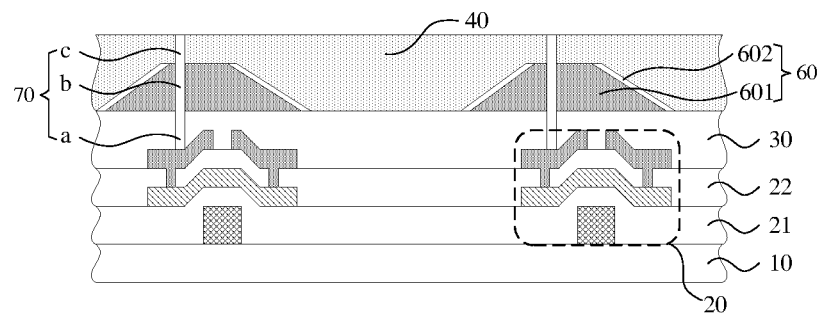

S4, as shown in FIG. 7, the planarization layer 40 is deposited above the formed reflective structure 60, and the third through hole (labeled as c in the drawings) is formed on the planarization layer 40 at locations overlapped with the locations of the first and second through holes by patterning process, to form the through hole 70 passing through the planarization layer 40, the reflective structure 60 and the protective layer 30.

Figure 8:
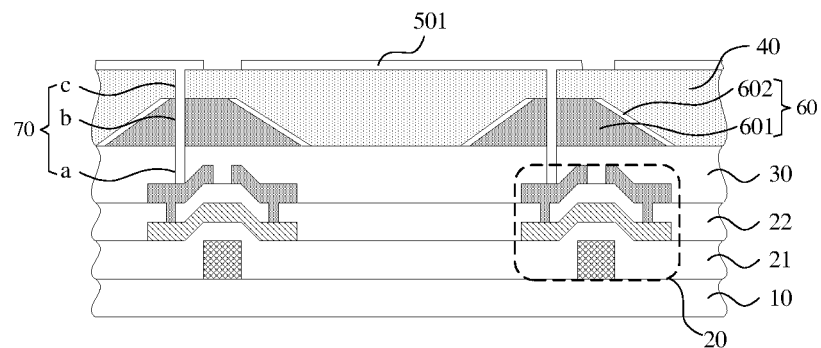

S5, as shown in FIG. 8, the transparent anode 501 corresponding to the respective OLED devices is deposited on the planarization layer 40, and the transparent anode 501 is connected with the drain electrode of the driving transistor 20 via the through hole 70 as formed previously.

Figure 9:
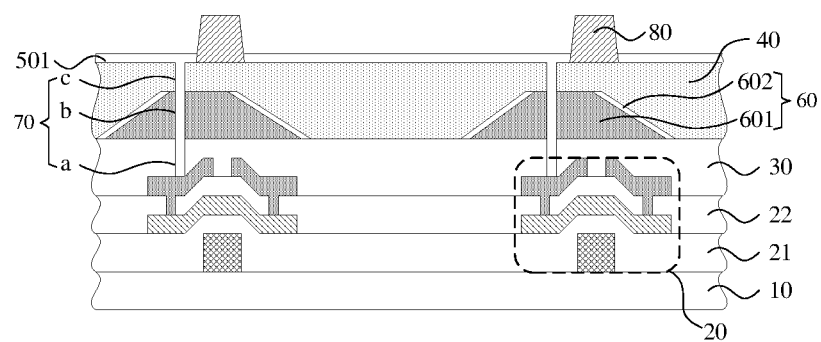

S6, as shown in FIG. 9, a pixel defining layer 80 with openings is formed on the substrate 10 formed with the transparent anode 501, by film formation, exposure, development, drying processes and so on, to define a light emitting area of a pixel. The height of the pixel defining layer 80 is for example 1 to 5 μm.

S7, as shown in 2A, an organic material functional layer 502 is formed on the opening part 801 of the pixel defining layer 80, by a film formation process such as evaporation or printing and so on (specifically, the organic material functional layer 502 may include a hole transport layer, a transport layer, a light emitting layer and an electron transport layer and so on in an order), and covers the metal cathode 503 of the entire substrate 10.

As such, by performing the above-mentioned steps S1 to S7, the above-mentioned bottom-emitting OLED display panel 01 provided by the embodiment of the present disclosure can be formed.

It is to be noted that, the drawings of the disclosure are merely simple diagrams of the bottom-emitting OLED display panel, for clearly describing structures related to the disclosed points of the present solution, but the drawings do not show or just show parts of other existing structures unrelated to the disclosed points.

The above description only shows the example embodiments of the present disclosure, but does not limit the protection scope of the present disclosure, and the protection scope of the present disclosure is limited by the attached claims.

The application claims priority of Chinese patent application No. 201510634549.0 filed on Sep. 29, 2015, which is incorporated herein by reference in entirety as a part of the present application.

What is claimed is:

1. A bottom-emitting organic-light-emitting-diode (OLED) display panel, comprising:
   a driving transistor disposed on a substrate,
   a protective layer covering the driving transistor;
   a planarization layer disposed on the protective layer;
   an OLED device disposed on the planarization layer; and
   a reflective structure disposed between the protective layer and the planarization layer, the reflective structure is configured for reflecting light emitted from the OLED device and radiated on the reflective structure;
   a bottom surface of the reflective structure which is close to the protective layer at least covers a region occupied by the driving transistor.

2. The bottom-emitting OLED display panel according to claim 1, wherein the reflective structure comprises a body part and a reflection layer.

3. The bottom-emitting OLED display panel according to claim 2, wherein, the body part has a bottom surface and a top surface arranged in parallel, and at least one side surface connecting the bottom surface and the top surface, the side surface is a concave cambered surface or a flat surface, and the reflective layer is at least disposed on one side surface of the body part.

4. The bottom-emitting OLED display panel according to claim 3, wherein an area of the bottom surface is larger than an area of the top surface, the bottom surface and the top surface are rectangles with geometric centers overlapped, and two adjacent sides of the rectangles respectively parallel a gate line and a data line of the bottom-emitting OLED display panel, and the body part has four side surfaces.

5. The bottom-emitting OLED display panel according to claim 2, wherein along a direction perpendicular to a panel surface of the bottom-emitting OLED display panel, a cross section pattern of the body part has a circular arc, and the circular arc is a semicircle or an inferior arc; and
   the reflective layer at least covers half of the circular arc, the half of the circular arc has a halving line in a direction in parallel with a gate line or a data line of the bottom-emitting OLED display panel.

6. The bottom-emitting OLED display panel according to claim 4, wherein the reflective layer is arranged on the four side surfaces of the body part, and the top surface and the bottom surface are both square.

7. The bottom-emitting OLED display panel according to claim 3, wherein
   the side surface of the body part is a concave cambered surface, and the concave cambered surface has a radian of 5 to 30° covered by the reflective layer; or
   the side surface of the body part is a flat surface, and an angle between the flat surface covered by the reflective layer and the bottom surface is 5 to 30°.

8. The bottom-emitting OLED display panel according to claim 5, wherein an angle between a tangent line at an end point of the inferior arc and the bottom surface of the reflective structure which is close to the protective layer is 5 to 30°.

9. The bottom-emitting OLED display panel according to claim 2, wherein
   the OLED device includes a transparent anode, an organic material functional layer and a metal cathode, which are gradually farther from the substrate; and
   the transparent anode is connected with a drain electrode of the driving transistor via a through hole passing through the planarization layer, the reflective structure and the protective layer.

10. The bottom-emitting OLED display panel according to claim 9, wherein
    the through hole passes through the reflective structure in a top surface of the body part.

11. The bottom-emitting OLED display panel according to claim 8, wherein, the OLED device includes a transparent anode, an organic material functional layer and a metal cathode, which are gradually farther from the substrate;
    the transparent anode is connected with a drain electrode of the driving transistor via a through hole passing through the planarization layer, the reflective structure and the protective layer,
    the through hole passes through the reflective structure via another half of the circular arc that is not covered by the reflective layer.

12. The bottom-emitting OLED display panel according to claim 2, wherein the reflective layer is mainly constituted of at least one selected from the group consisting of a metal simple substance and a metal alloy;
    wherein the metal simple substance is selected from the group consisting of argentum, zinc, aluminium, cuprum, manganese, germanium, yttrium, bismuth, scandium and cobalt,
    the metal alloy comprises at least one selected from the group consisting of argentum alloy, zinc alloy, aluminium alloy, cuprum alloy, manganese alloy, germanium alloy, yttrium alloy, bismuth alloy, scandium alloy and cobalt alloy.

13. The bottom-emitting OLED display panel according to claim 2, wherein the reflective layer has a thickness of 20 nm to 500 nm.

14. The bottom-emitting OLED display panel according to claim 2, wherein the body part is mainly constituted of a photosensitive resin material.

15. The bottom-emitting OLED display panel according to claim 2, wherein the body part has a thickness of 1 µm to 10 µm.

* * * * *